United States Patent [19]
Nakayama et al.

[11] Patent Number: 5,718,182
[45] Date of Patent: Feb. 17, 1998

[54] PRESSURE FOOT UNIT FOR SEWING MACHINE

[75] Inventors: Koichi Nakayama; Shinji Kojima, both of Utsunomiya, Japan

[73] Assignee: The Singer Company N.V., Curaco, Netherlands Antilles

[21] Appl. No.: 613,359

[22] Filed: Mar. 11, 1996

[30] Foreign Application Priority Data

Mar. 13, 1995 [JP] Japan ................................. 7-079366

[51] Int. Cl.$^6$ .................................................. D05B 29/06
[52] U.S. Cl. .......................................................... 112/235
[58] Field of Search .................................. 112/235, 240, 112/236

[56] References Cited

U.S. PATENT DOCUMENTS

| 1,339,121 | 5/1920 | Moffatt | 112/235 |
| 4,212,256 | 7/1980 | Jimenez | 112/240 |
| 4,213,411 | 7/1980 | Knowles | 112/240 |
| 4,548,145 | 10/1985 | Hirose | 112/240 |
| 4,744,317 | 5/1988 | Cullen et al. | 112/235 X |
| 5,289,790 | 3/1994 | Tseng | 112/235 |

*Primary Examiner*—Paul C. Lewis
*Attorney, Agent, or Firm*—McCormick, Paulding & Huber

[57] ABSTRACT

In a presser foot unit for a sewing machine, a holding member including a presser foot holding knuckle is provided. A presser foot having a pair of knuckles at the back end of the presser foot is also included. The knuckles on the presser foot are spaced apart to receive the presser foot holding knuckle. A presser foot support pin extends through the pair of knuckles on the presser foot and also through a groove in the presser foot holding knuckle, thereby mounting the presser foot to the holding member such that the presser foot can pivot about the support pin. The presser foot holding knuckle also forms curved protrusions that engage the pair of knuckles on the presser foot, such that the presser foot is constrained from moving laterally relative to the holding member. In addition, a spring is supported by the holding member for biasing the presser foot against a piece fabric during operation of the sewing machine. The spring includes an arm portion having a bent extremity that is inserted in a first opening formed in the holding member. Another longer arm portion of the spring engages the presser foot.

4 Claims, 6 Drawing Sheets

PRESSURE FOOT UNIT FOR SEWING MACHINE

BACKGROUND OF THE INVENTION

1. Field of the Invention

The present invention relates to a presser foot unit for a sewing machine.

2. Description of the Related Art

A presser foot unit for a sewing machine is attached to the free end of a presser bar to press a workpiece against a throat plate and a feed dog during sewing operation. A known presser foot unit of the type described above has a presser foot that swings up and down according to the thickness of a workpiece during a multilayer fabric sewing operation and/or a stepped fabric sewing operation. Referring to FIGS. 9 to 12, a conventional presser foot unit of such a kind for an overlock sewing machine comprises a presser foot holding member 54, a presser foot 50, a pin 59 inserted in a pair of knuckles 50b formed at the back end of the presser foot 50 and a knuckle 55 formed on the presser foot holding member 54 to support the presser foot 50 pivotally for swing motion thereon, and a hinge spring 57 having a coil portion 57a supported on the side surface of the presser foot holding member 54, a shorter upper arm 57b resting on the front surface of the presser foot holding member 54, and a longer lower arm 57c resting on the upper surface of the presser foot 50 and resiliently pressing the presser foot 50 downward. This conventional presser foot unit, however, has the following technical problems.

The knuckles 50b of the presser foot 50 and the knuckle 55 of the presser foot holding member 54 are formed so that the least necessary clearances n are formed between the knuckles 50b of the presser foot 50 and the knuckle 55 of the presser foot holding member 54, respectively, to restrain the front portion of the presser foot 50 from transverse play relative to the presser foot holding member 54. Therefore, the presser foot 50 is unable to roll in a vertical plane. Therefore, if the presser foot 50 is not correctly supported on the presser foot holding member 54 with its working surface 50a (FIG. 10) extended perpendicularly to the axis of the presser foot holding member 54 due to the unsatisfactory dimensional accuracies of the presser foot 50 and the presser foot holding member 54, the working surface 50a is unable to be in close contact with the throat plate 52 or the feed dog 53 as shown in FIG. 10 and to press a workpiece uniformly against the throat plate 52 or the feed dog 53. Consequently, the feed dog 53 is unable to feed the workpiece accurately, and the workpiece is dislocated transversely when the needle penetrates the workpiece causing faulty stitching. Increase in the dimensional accuracies of those parts to obviate such problems increases the cost of the sewing machine and will reduce the yield of the parts. The rolling motion of the front portion of the presser foot 50 is desirable to press a workpiece having transversely varying thickness as uniformly as possible against the feed dog 53. Therefore, the knuckles 50b of the presser foot 50 and the knuckle 55 of the presser foot holding member 54 are formed so that comparatively large clearances n are formed therebetween and the hole of the knuckle 55 receiving the pin 59 therethrough is formed so that there is a clearance between the knuckle 55 and the pin 59 to enable the presser foot 50 to move freely in a limited range so that the working surface 50a of the presser foot 50 is able to be in close contact with the throat plate 52 or the feed dog 53 to apply uniform pressure to the workpiece. This clearance, however, allows the front portion of the presser foot 50 to play transversely between positions 50' and 50" indicated by broken lines in FIG. 11 and, consequently, the presser foot 50 interferes with the needle 56 during sewing operation to break the needle 56 or irregular stitches are formed.

When another presser foot holding member 54' shown in FIG. 12 is employed, a longer lower arm 57c of a spring 57 is supported at its middle point on a projection 58 projecting from a side surface of the presser foot holding member 54'. When the front portion of the presser foot 50 is raised, the longer lower portion 57c of the spring 57 is liable to slip off the projection 58 and, if the longer lower arm 57c slips off the projection 58, the longer lower arm 57c needs to be returned onto the projection 58 where the longer lower arm 57c ought to stay. Whichever presser foot holding members 54 and 54' may be selected, the shorter upper arm 57b of the spring 57 rests on the outer surface of the presser foot holding member 54 or 54' with its extremity exposed. The exposed extremity of the shorter upper arm 57b obstructs work for changing the needle 56 and is liable to catch the workpiece.

SUMMARY OF THE INVENTION

The present invention has been made in view of the aforesaid problems in the prior art and it is an object of the present invention to provide a presser foot unit for a sewing machine, capable of solving the problems in the prior art.

A presser foot unit for a sewing machine, in accordance with a first aspect of the present invention comprises: a presser foot holding member having a presser foot holding knuckle; a presser foot having a pair of knuckles formed at the back end thereof so as to be disposed on the opposite sides, respectively, of the presser foot holding knuckle; a presser foot support pin transversely fitted in a groove formed in the presser foot holding knuckle of the presser foot holding member and having opposite ends fixedly pressed in holes formed in the pair of knuckles of the presser foot to support the presser foot for swing motion about its axis; and a pressing spring having a middle coil portion supported on one side surface of the presser foot holding member, a shorter arm extending from one end of the middle coil portion and engaging with the pressure foot holding member, and a longer arm extending from the other end of the middle coil portion and elastically pressed against the upper surface of the presser foot to bias the presser foot for downward turning about the axis of the presser foot support pin; in which the side surfaces of the presser foot holding knuckle of the presser foot holding member facing the knuckles of the presser foot are bulged to form curved protrusions.

The presser foot is able to swing about the axis of the presser foot support pin and the presser foot is restrained from transverse swing motion by the engagement of the curved protrusions of the presser foot with the inner side surfaces of the knuckles of the presser foot holding knuckle of the presser foot holding member. When the presser foot swings transversely in a horizontal plane, for example, a back portion of one of the curved protrusions engages with the back portion of the corresponding side surface of the presser foot holding knuckle, and the other curved protrusion engages with the front portion of the corresponding side surface of the presser foot holding knuckle to restrain the presser foot from transverse swing motion in a horizontal plane in an excessively large angular range satisfactorily. When the front portion of the presser foot rolls in a vertical plane, in which the opposite sides of the presser foot move alternately up and down, the inner surfaces of the knuckles of the presser foot slide along the corresponding curved protrusions of the presser foot holding knuckle, so that the working surface of the presser foot is able to be in close contact with the throat plate and the feed dog satisfactorily even if those component parts are not formed in a very high accuracy. The capability of the presser foot to roll in a vertical plane, in which the opposite sides of the front portion of the presser foot move alternately up and down, is advantageous in holding a workpiece having transversely varying thickness as uniformly as possible by the presser foot.

In a presser foot unit for a sewing machine, in accordance with a second aspect of the present invention, the bent extremity of the shorter arm of the pressing spring is inserted in a first opening formed in the presser foot holding member so that the tip of the bent extremity is in engagement with the edge of the first opening.

Since the bent extremity of the shorter arm of the pressing spring is inserted in the first opening of the presser foot holding member and the tip of the shorter arm is not on the surface of the presser foot holding member, the tip of the shorter arm of the pressing spring neither obstruct work for changing the needle nor catches the workpiece. Since the tip of the shorter arm is in engagement with the edge of the first opening, the shorter arm of the pressing spring is restrained from slipping off the first opening.

In a presser foot unit for a sewing machine, in accordance with a third aspect of the present invention, a loop formed in the middle portion of the longer arm of the pressing spring is inserted in a second opening formed in the presser foot holding member.

Although the longer arm of the pressing spring is turned upward when the presser foot is turned on the presser foot support pin so that the front end thereof is raised, the excessive upward turning and the transverse movement of the presser foot are forbidden because the loop formed in the middle portion of the longer arm of the pressing spring and inserted in the second opening is bent elastically, and a portion of the longer arm of the pressing spring forming the loop pressed against the upper edge of the second opening applies a frictional resistance against the transverse movement of the longer arm. Thus, the longer arm of the pressing spring is restrained from slipping off the presser foot holding member more reliably by the engagement of the loop and the upper edge of the second opening of the presser foot holding member than by the engagement of the middle portion of the longer arm of the pressing spring and the projection projecting from a side surface of the presser foot holding member of the conventional presser foot holding unit.

In a presser foot unit for a sewing machine, in accordance with a fourth aspect of the present invention, a protrusion is formed on the lower surface of the second opening, and the loop of the longer arm of the pressing spring is inserted in the second opening so as to wind around the protrusion.

The protrusion engaging with the loop of the longer arm of the pressing spring further satisfactorily prevents the longer arm of the pressing spring from slipping off the presser foot holding member.

BRIEF DESCRIPTION OF THE DRAWINGS

The above and other objects, features and advantages of the present invention will become more apparent from the following description taken in connection with the accompanying drawings, in which.

DETAILED DESCRIPTION OF THE PREFERRED EMBODIMENTS

Figure 1:
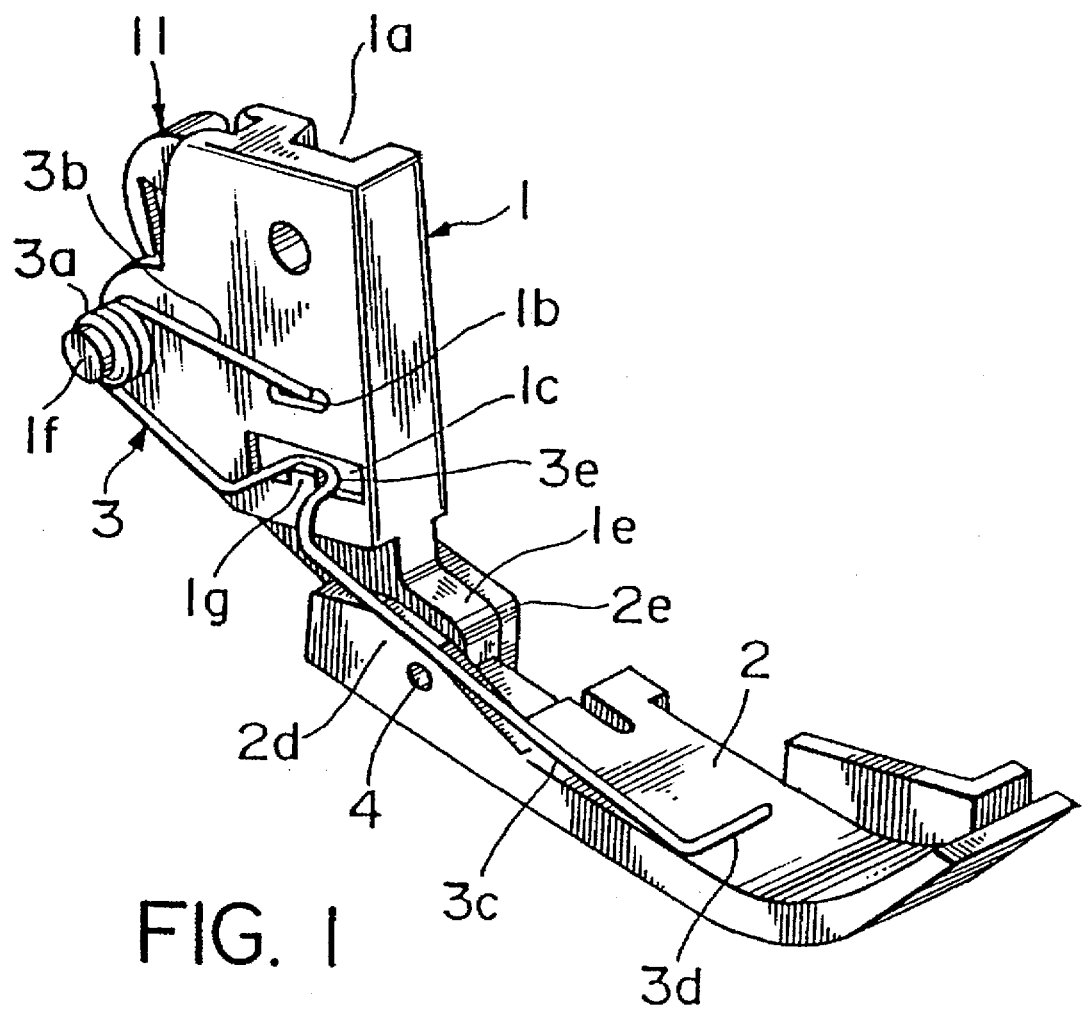
FIG. 1 is a perspective view of a presser foot unit for a sewing machine, in a preferred embodiment according to the present invention.
Figures 2, 3:
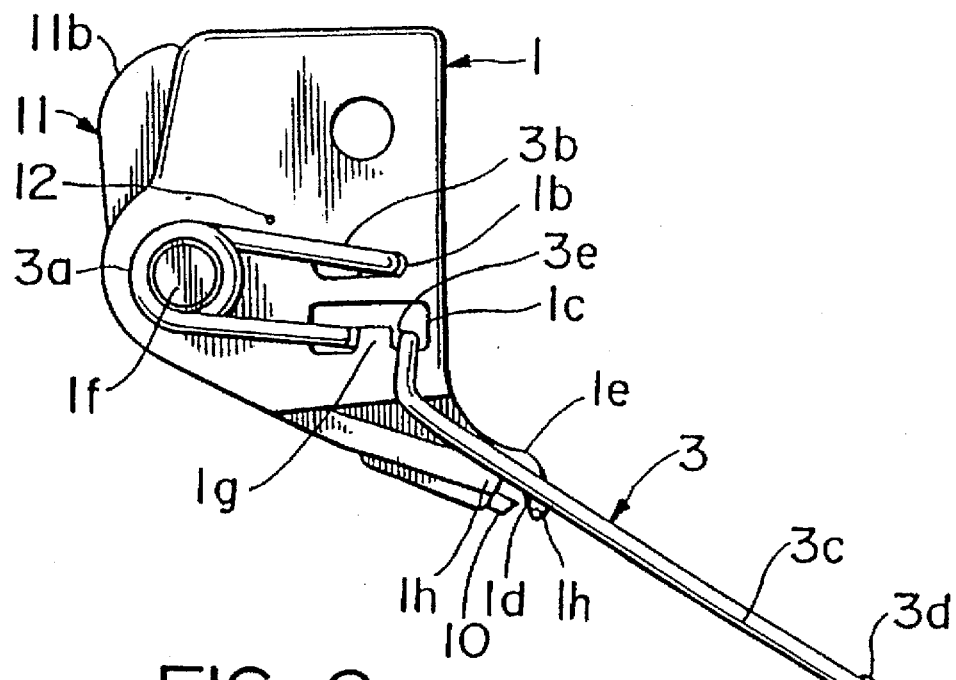
FIG. 2 is a left side view of the presser foot unit of FIG. 1, in which a presser foot is omitted.
FIG. 3 is a right side view of the presser foot unit of FIG. 1, in which a presser foot is omitted.
Figure 4:
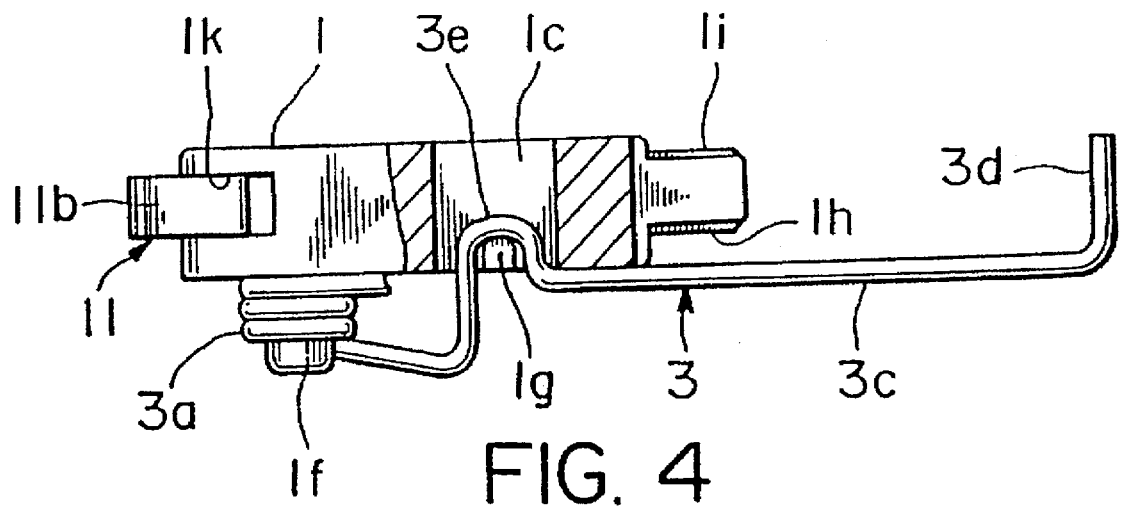
FIG. 4 is a partly sectional plan view of the presser foot unit of FIG. 1, in which a presser foot is omitted.
Figure 5:
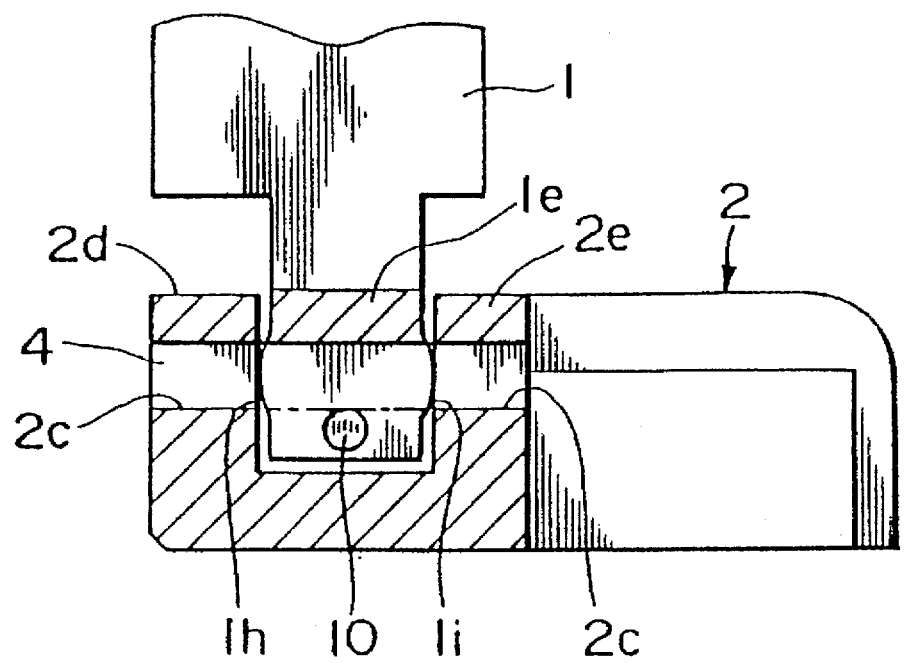
FIG. 5 is a sectional view of an essential portion of the presser foot unit of FIG. 1.
Figure 6:
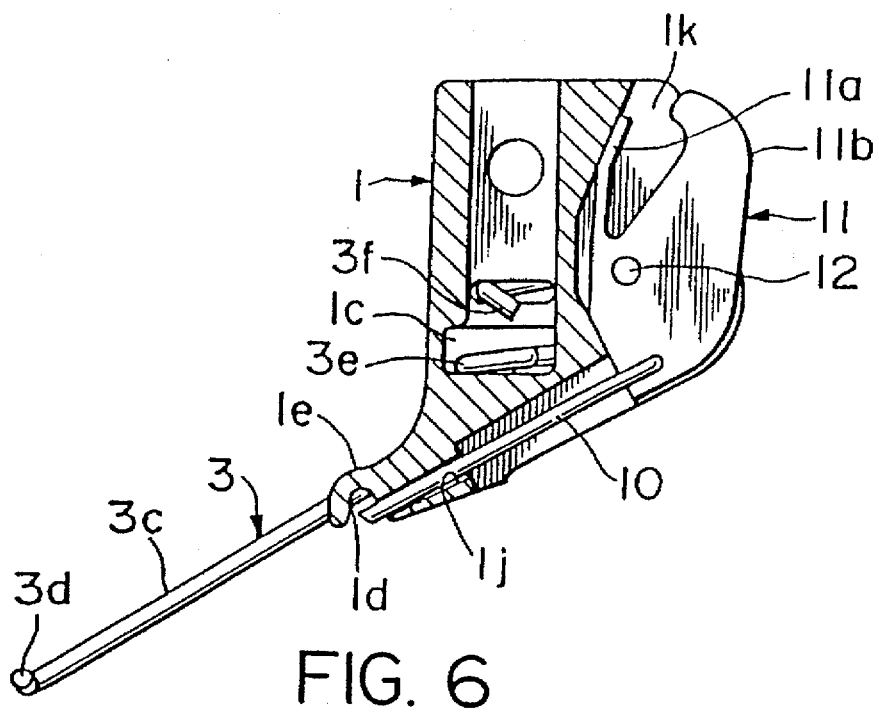
FIG. 6 is a partly sectional right side view of the presser foot unit of FIG. 1, in which a presser foot is omitted.
Figure 7:
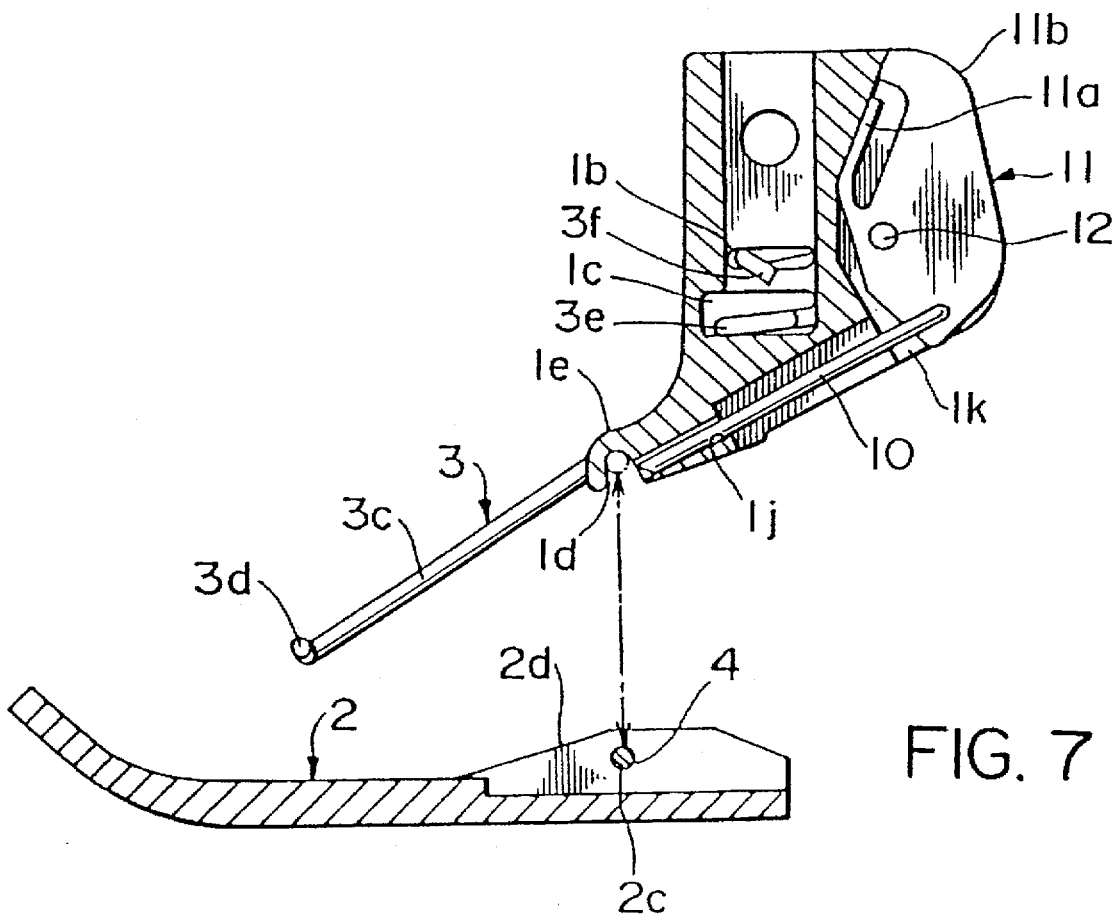
FIG. 7 is a view, similar to FIG. 6, of assistance in explaining the operation of the presser foot unit of FIG. 1.
Figure 8:
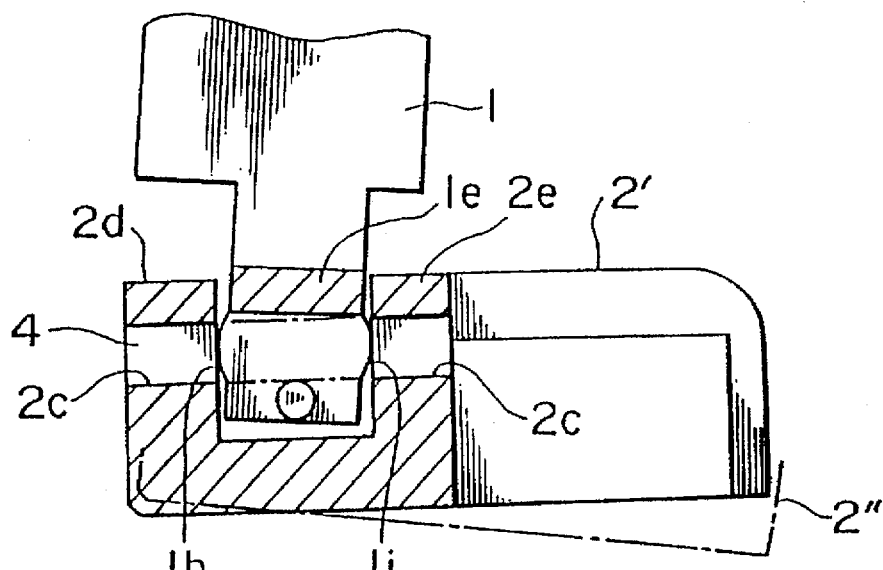
FIG. 8 is a view, similar to FIG. 5, of assistance in explaining the operation of the presser foot unit of FIG. 1.
Figure 9:
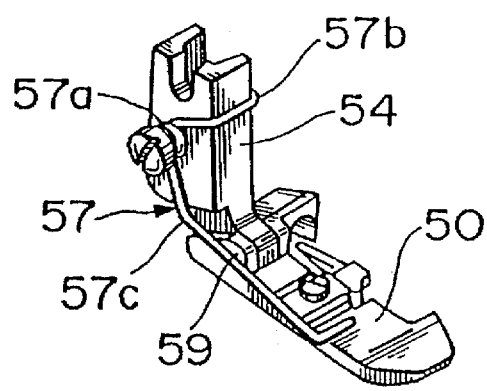
FIG. 9 is a perspective view of a conventional presser foot unit for a sewing machine.
Figure 10:
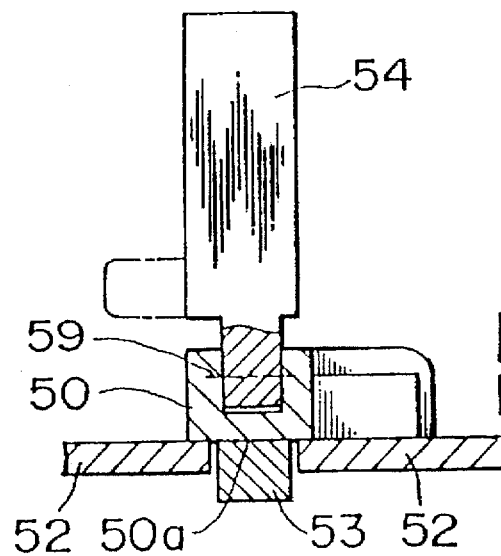
FIG. 10 is a partly sectional front view of the presser foot unit of FIG. 9, in which pressing spring is omitted.
Figure 11:
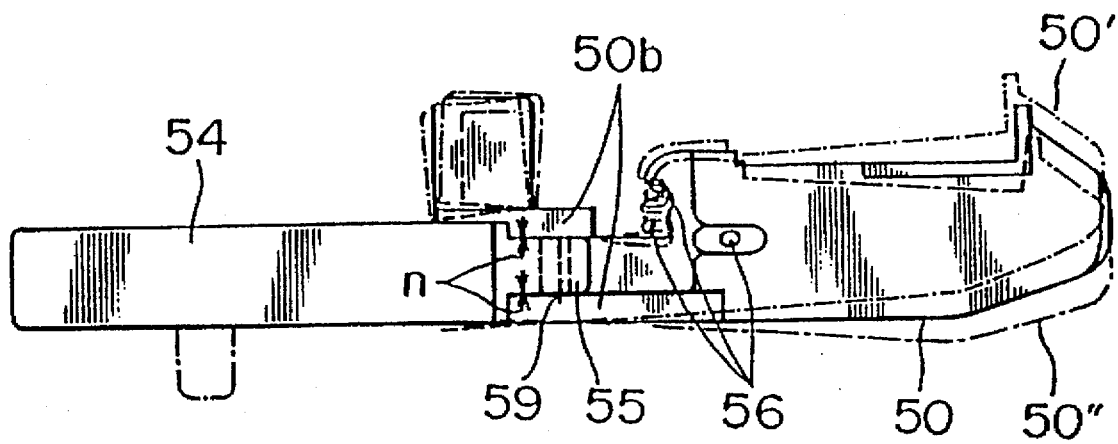
FIG. 11 is a plan view of assistance in explaining the operation of the presser foot unit of FIG. 9.
Figure 12:
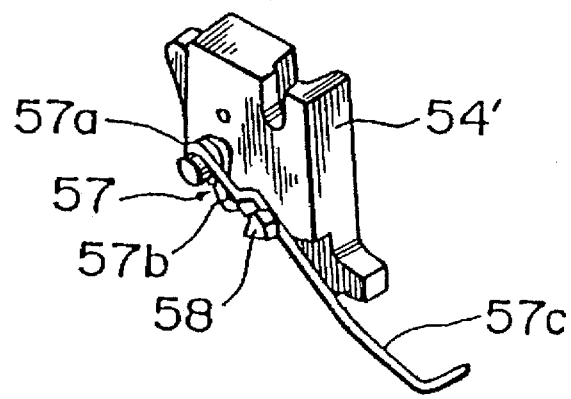
FIG. 12 is a perspective view of another conventional presser foot unit.

Referring to FIGS. 1 to 8 showing a presser foot unit in a preferred embodiment according to the present invention for an overlook sewing machine, the presser foot unit comprises a presser foot holding member 1, a presser foot 2 and a pressing spring 3. The presser foot holding member 1 is provided with a groove 1a as best shown in FIG. 3 and is attached to the lower end of a vertically supported presser bar, not shown, with the groove 1a in engagement with the lower end of the presser bar. The groove 1a is formed in one side surface of the presser foot holding member 1 and has an open end. The presser foot holding member 1 is provided with a first opening 1b formed through the middle portion thereof so as to open into the groove 1a, and a second opening 1c formed through the lower portion thereof so as to open into the groove 1a and provided on its flat lower surface with a protrusion 1g. The presser bar is received in the groove 1a so that the lower end thereof reaches a position above the first opening 1b. As shown in FIGS. 6 and 7, a swing member 11 formed of a synthetic resin to move an axially movable bar-shaped support member 10 substantially forward and backward is placed in a recess formed in the back portion of the presser holding member 1 and is supported on the presser foot holding member 1 for turning with a pin 12. The swing member 11 is provided with an elastic arm 11a extending upward in its front portion. The back end of the support member 10 is pivotal joined to the lower portion of the swing member 11. The front portion of the support member 10 is inserted slidably in a through hole 1j formed in the presser foot holding member 1. As shown in FIGS. 2 and 3, a groove 1d having a U-shaped cross section is formed so as to extend horizontally transversely in the lower surface of a knuckle 1e formed at the lower end of the presser foot holding member 1. The lower open end of the groove 1d coincides with the lower end of the through hole 1j of the knuckle 1e.

As shown in FIG. 1, the presser foot 2 is supported for swing motion on the presser foot holding member 1 with a presser foot support pin 4 received in the groove 1d so as to extend horizontally transversely so that the front portion thereof can be moved up and down. The opposite ends of the presser foot support pin 4 are fixedly pressed in holes formed in knuckles 2d and 2e formed on the opposite sides of the base portion of the presser foot 2, respectively, and the middle portion of the presser foot support pin 4 is fitted in the groove 1d of the presser foot holding member 1. The presser foot support pin 4 is held in the groove 1d of the presser foot holding member 1 with the support member 10 so as to be turnable.

When supporting the presser foot 2 on the presser foot holding member 1, the back portion 11b of the swing member 11 in a state shown in FIG. 6 is pushed elastically bending the elastic arm 11a to turn the swing member 11 counterclockwise, as viewed in FIG. 7 on the pin 12 so that the support member 10 is retracted into the through hole 1j to open the groove 1d of the presser foot holder 1. Then, the presser foot support pin 4 having opposite ends fixedly pressed in the holes of the knuckles 2d and 2e of the presser foot 2 is fitted in the open groove 1d from below and then the pressure applied to the back portion 11b is removed. Consequently, the swing member 11 is turned clockwise, as viewed in FIG. 6, by the resilience of the elastic arm 11a to project the support member 10, the lower open end of the groove 1d is closed to hold the presser foot support pin 4 in the groove 1d by the support member 10 to support the presser foot 2 for swing motion on the presser foot holding member 1.

(a) In FIG. 6, the sewing member is biased clockwise on the pin 12 by the resilience of the elastic arm 11a, and the support member 10 projects from the through hole 1i to close the groove 1d.

(b) In FIG. 7, the sewing member 11 is turned counterclockwise by an external force against the resilience of the elastic arm 11a, so that the support member 10 is retracted into the through hole 1j to open the groove 1d.

(c) The support pin 4 is inserted in the groove 1d in the state shown in FIG. 7 for use in the state shown in FIG. 6.

The pressing spring 3 has a coil portion 3a wound around a pin 1f projecting from the other side surface of the presser foot holding member 1, a shorter arm 3b extending from one end of the coil portion 3a and having a bent end 3f (FIG. 3) inserted in the first opening 1b of the presser foot holding member 1, and a longer arm 3c extending from the other end of the coil portion 3a and having a bent end 3d formed by bending its free end at right angles and elastically pressed against a front portion of the upper surface of the presser foot 2. The bent end 3f is formed by bending the end portion of the shorter arm 3b in a shape substantially resembling the letter U and has a transverse section and a declining section extending from the transverse section. Since the first opening 1b opens into the groove 1a as shown in FIG. 3, the bent end 3f holds to a portion of the side wall of the presser foot holding member 1 defining the first opening 1b. A loop 3e is formed by bending a middle portion of the longer arm 3c of the pressing spring 3. The loop 3e is inserted in the second opening 1c of the presser foot holding member 1 and is pressed against the lower surface of the second opening 1c. A protrusion 1g is formed on the lower surface of the second opening 1c of the presser foot holding member 1 at a middle position with respect to the length of the second opening 1c. The loop 3e is inserted in the second opening 1c so as to wind around the protrusion 1g and is pressed elastically against the lower surface of the second opening 1c. The pressing spring 3 presses the presser foot 2 elastically so that the presser foot 2 is biased for downward turning on the presser foot support pin 4. The loop 3e of the pressing spring 3 elastically pressed against the lower surface of the second opening 1c enables the application of an accurate elastic force to the presser foot 2 by the bent end 3d of the longer arm 3c.

The opposite side surfaces of the knuckle 1e of the presser foot holding member 1 holding the presser foot support pin 4 are bulged in curved protrusions 1h and 1i of a predetermined shape extending on the front and the back side of the presser foot support pin 4. The curved protrusions 1h and 1i of the knuckle 1e are in contact with the flat inner side surfaces of the knuckles 2d and 2e of the presser foot 2, respectively. More concretely, the curved protrusions 1h and 1i extend linearly extending substantially lengthwise across the axis of the through hole 1d of the presser foot holding member 1 and have a semicylindrical cross section. Each of the curved protrusions 1h and 1i are divided into a front section and a back section by the through hole 1d at the middle portion thereof. When the presser foot 2 is attached to the presser foot holding member 1, the flat inner side surfaces of the knuckles 2d and 2e of the presser foot 2 are in contact with the curved protrusions 1h and 1i, respectively. The curved protrusions 1h and 1i allow the knuckles 2d and 2e to turn in a vertical plane and restrain the front portion of the presser foot 2 from transverse swing motion in a horizontal plane.

Thus, the presser foot 2 is supported on the presser foot support member 1 by fitting the presser foot support pin 4 having opposite ends fixedly pressed in the holes of the knuckles 2d and 2e of the presser foot 2 in the groove 1d of the pressure foot holding member 1 and retaining the presser foot support pin 4 in the groove 1d with the support member 10. The coil portion 3a of the pressing spring 3 is wound around the pin 1f projecting from the side surface of the presser foot holding member 1, the bent end 3f of the shorter arm of the pressing spring is inserted in the first opening 1b of the presser foot holding member 1, loop 3e of the longer arm 3c is inserted in the second opening 1c of the presser foot holding member 1 so as to wind around the protrusion 1g and to be pressed against the lower surface of the second opening 1c, and the bent end 3d of the longer arm 3c is in elastic contact with the upper surface of the front portion of the presser foot 2. Thus, the work for attaching the pressing spring 3 to the presser foot holding member 1 can be entirely performed on the side of one side surface of the presser foot holding member 1.

The presser foot unit presses a workpiece elastically against the throat plate, not shown, and a feed dog, not shown, during sewing operation. Since the inner surfaces of the knuckles 2d and 2e of the presser foot 2 are in sliding contact with the curved protrusions 1h and 1i, the presser foot 2 is able to turn in a vertical plane about the axis of the presser foot support pin 4 and the front portion of the presser foot 2 is able to move up and down, so that the front portion of the presser foot 2 is able to move up and down according to the thickness of the workpiece during multilayer fabric sewing operation and stepped fabric sewing operation. Accordingly, a wide area of the working surface of the presser foot 2 is able to be in close contact with the workpiece to press the workpiece securely against the throat plate or the feed dog. The presser foot support pin 4 fixedly pressed in the holes of the knuckles 2d and 2e of the presser foot 2 is able to turn in the groove 1d of the presser foot holding member 1 relative to the end portion of the support member 10.

Although the presser foot 2, similarly to the presser foot of the conventional presser foot unit, tends to swing transversely together with the presser foot support pin 4 to interfere with the stitching operation of the needle, causing the needle to break or to stitch irregular stitches, the presser foot 2 is restrained from transverse swing motion by the engagement of the curved protrusions 1h and 1i of the presser foot holding member 1 and the inner surfaces of the knuckles 2d and 2e of the presser foot 2. For example, if the presser foot 2 tends to swing to the left, as viewed in FIG. 1, the back portion of the curved protrusion 1h (FIG. 5) engages with the back portion of the inner surface of the knuckle 2d, and the front portion of the curved protrusion 1i engages with the front portion of the inner surface of the knuckle 2e to restrain the presser foot 2 from swinging in an excessively wide angular range.

The rolling motion of the presser foot 2 in a vertical plane is desirable for holding down a workpiece having transversely varying thickness. The curved protrusions 1h and 1i formed on the opposite side surfaces of the knuckle 1e of the presser foot holding member 1, respectively, and each having a portion extending on the front side of the presser foot support pin 4 and the other portion extending on the back side of the presser foot support pin 4 allow the presser foot 2 to roll satisfactorily. If the presser foot 2 rolls between a position 2' indicated by continuous lines and a position 2" indicated by alternate long and short dash lines in FIG. 8, the inner side surfaces of the knuckles 2d and 2e of the presser foot 2 slides along the curved protrusions 1h and 1i without being obstructed by the knuckle 1e of the presser foot holding member 1. Since the end portion of the support member 10 is loosely fitted in the through hole 1j of the presser foot holding member 1, the end portion of the support member 10 moves up and down as the presser foot 2 rolls relative to the knuckle 1e of the presser foot holding member 1.

When the presser foot 2 is turned upward about the axis of the presser foot support pin 4 to raise the front portion thereof, the longer arm 3c of the pressing spring 3 is bent elastically upward, and the loop 3e of the longer arm 3c of the pressing spring 3 pressed elastically against the lower surface of the second opening 1c of the presser foot holding member 1 is pressed against the upper surface of the second opening 1c. The engagement of the loop 3e and the upper surface of the second opening 1c limits the upward bending of the longer arm 3c, and the friction between the loop 3e and the upper surface of the second opening 1c restrains the longer arm 3c from transverse movement. Thus, the engagement of the loop 3e and the upper surface of the second opening 1c prevents the longer arm 3c of the pressing spring 3 from slipping off the presser foot holding member 1 more effectively than the engagement of the longer arm 3c and the projection 58 projecting from the side surface of the presser foot holding member in the aforesaid conventional presser foot unit. Since the loop 3e is wound around the protrusion 1g formed at the middle position on the lower surface of the second opening 1c, the protrusion 1g further prevents the loop 3e from slipping off the second opening 1c when the longer arm 3c is bent upward.

Since the bent end 3f of the shorter arm 3b of the pressing spring 3 is inserted and concealed in the first opening 1b opening in the side surface of the presser foot holding member 1, holds to the edge of the first opening 1b and does not extend on the front and the other side surface of the presser foot holding member 1, operation for changing the needle is not obstructed by the shorter arm 3b, the workpiece is caught hardly by the shorter arm 3b, and the shorter arm 3b is hardly able to slip out off the presser foot holding member 1.

Incidentally, the curved protrusions 1h and 1i are formed on the opposite side surfaces of the knuckle 1e, respectively, so as to extend on both the front and the back side of the presser foot support pin 4 in this embodiment, curved protrusions similar to the curved protrusions 1h and 1i may be formed on the inner surfaces of the knuckles 2d and 2e of the presser foot 2 for the same effect. Curved protrusions having a cross section of any suitable shape may be used instead of the curved protrusions 1h and 1i having a semi-cylindrical cross section, provided that the curved protrusions permit the swing motion of the presser foot 2 about the axis of the presser foot support pin 4 and the rolling motion of the presser foot 2, and are able to restrain the presser foot 2 from transverse turning in a horizontal plane.

What is claimed is:

1. A presser foot unit for a sewing machine comprising;
   a presser foot holding member having opposed surfaces and a presser foot holding knuckle, the presser foot holding knuckle having opposite sides defining curved protrusions;
   a presser foot having a pair of opposed knuckles, each having an inner side surface, formed at a back end thereof, the inner side surfaces being disposed about the opposite sides of the presser foot holding knuckle, thereby contacting the curved protrusions and preventing lateral movement of the presser foot;
   a presser foot support pin transversely fitted in a groove formed in the presser foot holding knuckle of the presser foot holding member and having opposite ends fixedly pressed in holes formed in the pair of opposed knuckles of the presser foot to support the presser foot for pivotal movement about its axis; and
   a spring having a middle coil portion supported on one of the opposed surfaces of the presser foot holding member, a shorter arm extending from one end of the middle coil portion and engaged with the presser foot holding member, and a longer arm extending from the other end of the middle coil portion and being elastically pressed against an upper surface of the presser foot to bias the presser foot about the axis of the presser foot support pin.

2. A presser foot unit for a sewing machine comprising;
   a presser foot holding member having opposed surfaces one of which defines an interior groove and an opening extending into the interior groove; and a presser foot holding knuckle having opposite sides;
   a presser foot having a pair of opposed knuckles, each having an inner side surface, formed at a back end thereof such that the inner side surfaces are disposed about the opposite sides of the presser foot holding knuckle;
   a presser foot support pin transversely fitted in a groove formed in the presser foot holding knuckle of the presser foot holding member and having opposite ends fixedly pressed in holes formed in the pair of knuckles of the presser foot to support the presser foot for pivotal movement about its axis;
   a spring having a middle coil portion supported on one of the opposed surfaces of the presser foot holding member a shorter arm extending from one end of the middle coil portion engaged with the presser foot holding member and a longer arm extending from the other end of the middle coil portion and being elastically pressed against an upper surface of the presser foot to bias the presser foot about the axis of the presser foot support pin; and
   the shorter arm including a bent extremity having a tip, the bent extremity being inserted in the opening formed in the presser foot holding member so that the tip of the bent extremity extends into the groove and engages an edge of the opening.

3. A presser foot unit for a sewing machine comprising:

a presser foot holding member having opposed surfaces; and a presser foot holding knuckle having opposite sides;

a presser foot having a pair of opposed knuckles, each having an inner side surface, formed at a back end thereof such that the inner side surfaces are disposed about the opposite sides of the presser foot holding knuckle;

a presser foot support pin transversely fitted in a groove formed in the presser foot holding knuckle of the presser foot holding member and having opposite ends fixedly pressed in holes formed in the pair of knuckles of the presser foot to support the presser foot for pivotal movement about its axis; and a spring having a middle coil portion supported on one of the opposed surfaces of the presser foot holding member, a shorter arm extending from one end of the middle coil portion and engaged with the presser foot holding member and a longer arm extending from the other end of the middle coil portion and being elastically pressed against the upper surface of the presser foot to bias the presser foot for downward turning about the axis of the presser foot support pin, the spring having a loop formed in the middle portion of the longer arm of the spring, the loop being inserted in an opening formed in the presser foot holding member.

4. A presser foot holding unit for a sewing machine, according to claim 3 wherein a protrusion is formed on a lower surface of the opening in the presser foot holding member, and the loop of the longer arm of the spring is inserted in the opening so as to wind around the protrusion.

* * * * *